(12) United States Patent
Oda et al.

(10) Patent No.: US 6,518,623 B1
(45) Date of Patent: Feb. 11, 2003

(54) SEMICONDUCTOR DEVICE HAVING A BURIED-CHANNEL MOS STRUCTURE

(75) Inventors: Hidekazu Oda, Tokyo (JP); Masashi Kitazawa, Tokyo (JP); Katsuomi Shiozawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 34 days.

(21) Appl. No.: 09/718,486

(22) Filed: Nov. 24, 2000

(30) Foreign Application Priority Data

Jun. 9, 2000 (JP) ......... 2000-173011

(51) Int. Cl.[7] ......... H01L 29/76; H01L 29/94; H01L 31/062; H01L 31/113; H01L 31/119
(52) U.S. Cl. ......... 257/330; 257/331; 257/345; 257/402; 257/403; 257/409
(58) Field of Search ......... 257/345, 330, 257/331, 402, 403, 327, 409

(56) References Cited

U.S. PATENT DOCUMENTS

| | | | |
|---|---|---|---|
| 5,710,438 A | 1/1998 | Oda et al. | 257/69 |
| 5,950,098 A | 9/1999 | Oda et al. | 438/527 |
| 5,960,270 A | 9/1999 | Misra et al. | 438/197 |

FOREIGN PATENT DOCUMENTS

| | | | | |
|---|---|---|---|---|
| JP | 55-130171 | | 10/1980 | |
| JP | 63-81978 | * | 4/1988 | 257/409 |
| JP | 4-278586 | * | 10/1992 | 257/330 |
| JP | 6-216379 | | 8/1994 | |

* cited by examiner

*Primary Examiner*—Steven Loke
(74) *Attorney, Agent, or Firm*—Oblon, Spivak, McClelland, Maier & Neustadt, P.C.

(57) ABSTRACT

A gate electrode is buried in a trench formed in the main surface of a semiconductor substrate and faces a counter doped layer, and source/drain layers are formed on both sides of the trench. Thus the source/drain layers are formed in shallower areas than the counter doped layer. As a result, the punch-through resistance is improved.

3 Claims, 12 Drawing Sheets

F / G. 4
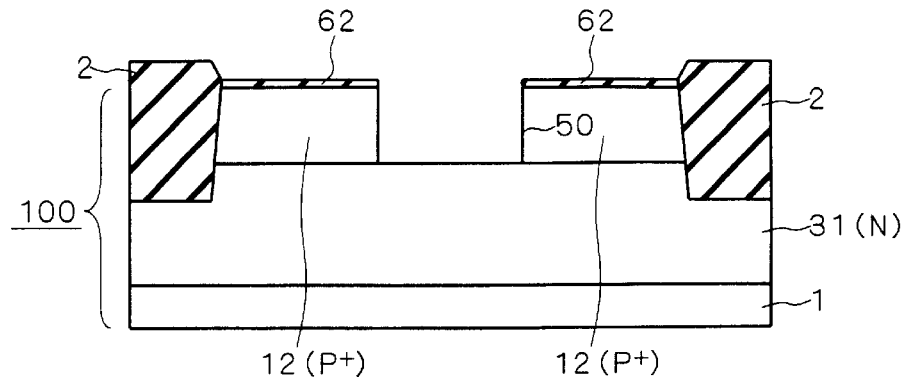
F / G. 5
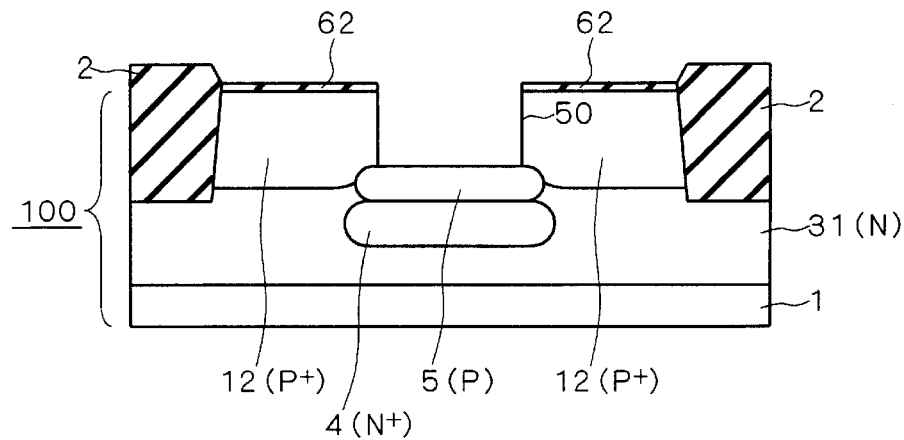
F / G. 6
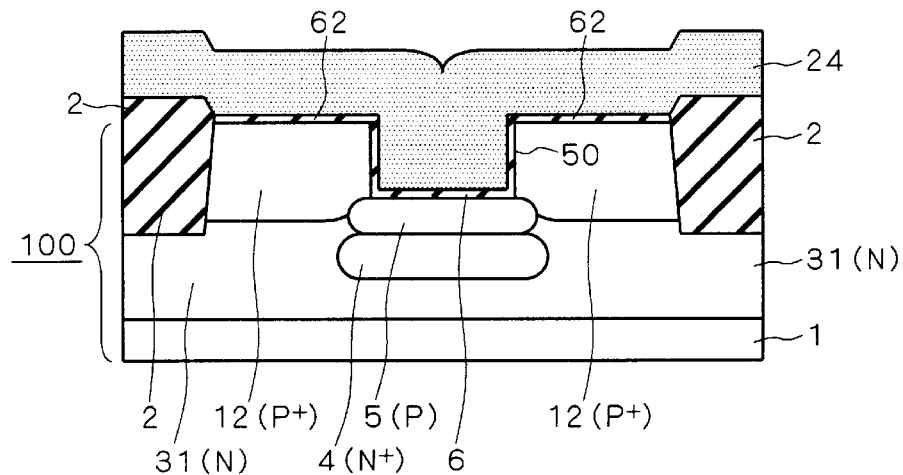

SEMICONDUCTOR DEVICE HAVING A BURIED-CHANNEL MOS STRUCTURE

BACKGROUND OF THE INVENTION

1. Field of the Invention

The present invention relates to a semiconductor device having a buried-channel MOS structure in the main surface of a semiconductor substrate and a manufacturing method thereof.

2. Description of the Background Art

With the recent higher integration of semiconductor devices typically including SRAMs and DRAMs, an increasing number of elements are fabricated on a single chip. These elements mostly include, particularly as transistors, field-effect transistors called MOSFETs (Metal Oxide Silicon Field Effect Transistors). The MOSFETs include nMOSFETs (negative MOSFETs) where electrons carry current and pMOSFETs (positive MOSFETs) where holes carry current; the nMOSFETs and pMOSFETs have different electric polarities. Various kinds of circuits are constructed using combinations of nMOSFETs and pMOSFETs.

Known structures of MOSFETs include the surface channel type shown in FIG. 29 and the buried channel type shown in FIG. 30. In the semiconductor device 151 shown in FIG. 29, the semiconductor substrate 100 has source/drain layers 12 separated at an interval (a pair of a source layer and a drain layer are generically called source/drain layers), a punch-through stopper layer 4, and element isolation regions 2 for isolating a plurality of elements. The source/drain layers 12 and the punch-through stopper layer 4 have opposite conductivity types. The semiconductor layer 1 is left under the punch-through stopper layer 4 as part of the semiconductor substrate 100.

A gate electrode 7 faces the space between the source/drain layers 12 with an insulating film 6 interposed between them. The gate electrode 7 has insulator spacers 11 on its side surfaces. Source/drain electrodes 14 (a pair of a source electrode and a drain electrode are generically called source/drain electrodes) are connected to the source/drain layers 12. The gate electrode 7 and the source/drain electrodes 14 are insulated from each other by an insulating layer 13 covering the main surface of, the semiconductor substrate 100. In the semiconductor device 151 thus constructed, the surface portion of the punch-through stopper layer 4 which faces the gate electrode 7 functions as a channel region.

In the semiconductor device 152 shown in FIG. 30, the semiconductor substrate 100 further includes a counter doped layer 5 and a well layer 31, in addition to the source/drain layers 12, punch-through stopper layer 4 and element isolation regions 2. The counter doped layer 5 has the same conductivity type as the source/drain layers 12 and the well layer 31 has the same conductivity type as the punch-through stopper layer 4. The semiconductor layer 1 is left under the well layer 31 as part of the semiconductor substrate 100. In the semiconductor device 152 thus constructed, a region around a PN junction between the counter doped layer 5 and the punch-through stopper layer 4, which faces the gate electrode 7, functions as the channel region. That is, the region spaced from the main surface functions as the channel region. This channel region is called "buried channel region."

In these semiconductor devices 151 and 152, the source/drain layers 12 and the channel region are formed by using impurity ion implantation or by using impurity diffusion from solid phase which contains the impurities. N-type diffusion layers contain N-type impurities such as phosphorus and arsenic and P-type diffusion layers contain P-type impurities such as boron.

Usually, in order to form the gate electrodes with the same material in nMOSFETs and pMOSFETs, nMOSFETs generally use the surface channel type and pMOSFETs use the buried channel type. Accordingly, in most cases, the semiconductor device 151 is formed as an nMOSFET as shown in FIG. 29 and the semiconductor device 152 is formed as a pMOSFET as shown in FIG. 30.

FIGS. 31 to 36 are manufacturing process diagrams showing a method of manufacturing the semiconductor device 152. In the manufacture of the semiconductor device 152, first, the semiconductor substrate 100 is prepared and the element isolation regions 2 are formed in its main surface by LOCOS (Local Oxidation of Silicon) etc. (FIG. 31). Next, phosphorus is implanted to form the N-type well layer 31, and then phosphorus is implanted by ion implantation with an implantation energy of 100 keV to a dose of $6.0 \times 10^{12}$ ions/cm$^2$ or more, for example, to form the punch-through stopper layer 4. Subsequently boron is implanted with an implantation energy of 20 keV and, as in the formation of the punch-through stopper layer 4, to a dose of $6.0 \times 10^{12}$ ions/cm$^2$ or more, to form the counter doped layer 5 (FIG. 32).

Next, a thermal oxidation is performed to form a 2- to 15-nm-thick film of oxide, as the insulating film 6, on the main surface of the semiconductor substrate 100. Subsequently, polycrystalline silicon 53 containing phosphorus at a concentration of $1 \times 10^{20}$/cm$^3$ or more is deposited by LPCVD (Low Pressure CVD) to a thickness of 50 to 150 nm. Next, as an etching mask for formation of the gate electrode, a silicon oxide film 8 is deposited by CVD to a thickness of 20 nm, which is followed by formation of a resist pattern 9 used to form the gate electrode (FIG. 33).

Next, using the resist pattern 9 as a mask, the silicon oxide film 8 and the polycrystalline silicon 53 are selectively etched to form the gate electrode 7 from the polycrystalline silicon 53. The resist pattern 9 is then removed (FIG. 34).

Next, an oxide film is deposited to a thickness of 50 to 100 nm to cover the entirety of the main surface of the semiconductor substrate 100, which is etched back to form the insulator spacers 11 on the side surfaces of the gate electrode 7 (FIG. 35).

Next, boron is implanted into the main surface of the semiconductor substrate 100 under the implant conditions of 5 to 30 keV and $1.0 \times 10^{15}$ ions/cm$^2$, thus forming the P$^+$ source/drain layers 12 (FIG. 36). Subsequently, a thermal process is performed at high temperature for activation and repair of crystal defects caused by the ion implantation during formation of the source/drain layers 12. Next, referring to FIG. 30 again, the insulating layer 13 and the source/drain electrodes 14 are formed to complete the semiconductor device 152.

In buried-channel MOSFETs as exemplified by the semiconductor device 152, the advances in miniaturization is incurring the problem that a current which cannot be controlled with the gate voltage is likely to flow in the buried channel region, which is called punch-through current. The punch-through can be effectively suppressed by increasing the impurity concentration in the punch-through stopper layer 4 or by forming a shallower counter doped layer 5 and increasing the impurity concentration thereof.

However, increasing the impurity concentration of the punch-through stopper layer 4 increases the threshold voltage, which leads to another problem of lower driving capability. Further, it is difficult to finally obtain a shallow counter doped layer 5 with higher impurity concentration, since the high-temperature thermal process for activating the source/drain layers 12 which is performed after the formation of the counter doped layer 5 diffuses the impurity in the counter doped layer 5.

SUMMARY OF THE INVENTION

The present invention has been made to solve the above-described problems of the conventional art, and an object of the present invention is to provide a semiconductor device which has excellent resistance to punch-through and is suitable for miniaturization and a manufacturing method thereof.

According to a first aspect of the present invention, a semiconductor device comprises: a semiconductor substrate having a main surface and a trench selectively formed in the main surface, the semiconductor substrate comprising a first semiconductor layer of a first conductivity type formed under the trench and a region around the trench, a second semiconductor layer of a second conductivity type formed on the first semiconductor layer on both sides of the trench and exposed on the main surface, a third semiconductor layer of the second conductivity type formed on the first semiconductor layer, the third semiconductor layer being in contact with the bottom of the trench and coupled to the second semiconductor layer, and a fourth semiconductor layer of the first conductivity type selectively formed to cover at least part of the junction between the third semiconductor layer and the first semiconductor layer and having a higher impurity concentration than the first semiconductor layer; the semiconductor device further comprising an insulating film covering a surface of the trench; and an electrode buried in the trench and facing the third semiconductor layer with the insulating film interposed therebetween.

Preferably, according to a second aspect, the semiconductor device further comprises a pair of insulator spacers spaced apart from each other and covering a pair of side surfaces of the trench, wherein the electrode faces the third semiconductor layer in a region interposed between the pair of insulator spacers.

According to a third aspect of the present invention, a semiconductor device comprises a semiconductor substrate having a main surface, the semiconductor substrate comprising a first semiconductor layer of a first conductivity type, a second semiconductor layer of a second conductivity type formed on a surface of the first semiconductor layer, the second semiconductor layer being divided at an interval and selectively exposed on the main surface, a third semiconductor layer of the second conductivity type formed on the surface of the first semiconductor layer, the third semiconductor layer being formed in the interval in the main surface and coupled to the second semiconductor layer, and a fourth semiconductor layer of the first conductivity type selectively formed to cover at least part of the junction between the third semiconductor layer and the first semiconductor layer and having a higher impurity concentration than the first semiconductor layer; the semiconductor device further comprising an insulating layer formed on the main surface and having an opening which opens to the interval in the main surface; a pair of insulator spacers spaced apart from each other and covering a pair of side surfaces of the opening which face each other across the interval; an insulating film covering part of the main surface which is exposed in the opening; and an electrode buried in the opening and facing the third semiconductor layer through the insulating film in a region between the pair of insulator spacers in the opening.

Preferably, according to a fourth aspect, in the semiconductor device, the fourth semiconductor layer is narrower than the third semiconductor layer in the width along the main surface.

Preferably, according to a fifth aspect, in the semiconductor device, the fourth semiconductor layer is spaced apart from the second semiconductor layer.

According to a sixth aspect of the present invention, a method of manufacturing a semiconductor device comprises the steps of: (a) preparing a semiconductor substrate having a main surface; (b) introducing an impurity of a first conductivity type into the main surface to form a first semiconductor layer of the first conductivity type; (c) introducing an impurity of a second conductivity type into the main surface to form a second semiconductor layer of the second conductivity type on the first semiconductor layer; (d) selectively forming a trench in the main surface so as to divide a region where the second semiconductor layer is exposed on the main surface; (e) introducing an impurity of the second conductivity type through the trench to selectively form a third semiconductor layer of the second conductivity type in such a manner that the third semiconductor layer is in contact with the bottom of the trench and is coupled to the second semiconductor layer; (f) after the step (d) at the earliest, introducing an impurity of the first conductivity type through the trench to selectively form a fourth semiconductor layer of the first conductivity type having a higher impurity concentration than the first semiconductor layer in such a manner that the fourth semiconductor layer covers at least part of the junction between the third semiconductor layer and the first semiconductor layer after the step (e); (g) after the step (d) at the earliest, forming an insulating film to cover a surface of the trench; and (h) after all of the steps (e) to (g), burying an electrode in the trench in such a manner that the electrode faces the third semiconductor layer with the insulating film interposed therebetween.

Preferably, according to a seventh aspect, the semiconductor device manufacturing method further comprises a step (i) of, after the step (e) and before the step (f), forming a pair of insulator spacers covering a pair of side surfaces of the trench, wherein in the step (h), the electrode is buried in the trench so that the electrode faces the third semiconductor layer in a region interposed between the pair of insulator spacers.

According to an eighth aspect of the present invention, a method of manufacturing a semiconductor device comprises the steps of: (a) preparing a semiconductor substrate having a main surface; (b) introducing an impurity of a first conductivity type into the main surface to form a first semiconductor layer of the first conductivity type; (c) selectively forming a shield on the main surface; (d) after the step (c), introducing an impurity of a second conductivity type into the main surface to selectively form a second semiconductor layer of the second conductivity type in a surface of the first semiconductor layer in such a manner that the second semiconductor layer has an interval right under the shield; (e) after the step (d), forming an insulating layer to cover the main surface with the upper surface of the shield being exposed; (f) removing the shield to selectively form an opening in the insulating layer; (g) introducing an impurity of the second conductivity type through the opening to form a third semiconductor layer of the second conductivity type in the interval in the main surface in the surface of the first semiconductor layer in such a manner that the third semiconductor layer is coupled to the second semiconductor layer; (h) after the step (g), forming a pair of insulator spacers spaced apart from each other and covering a pair of opposite side surfaces of the opening; (i) after the step (f) at the earliest, introducing an impurity of the first conductivity type through the opening to selectively form a fourth semiconductor layer of the first conductivity type having a higher impurity concentration than the first semiconductor layer in such a manner that the fourth semiconductor layer covers at least part of the junction between the third semiconductor layer and the first semiconductor layer; (j) after the step (f) at the earliest, forming an insulating film covering the surface exposed in the opening; and (k) after all of the steps (f) to (j), burying an electrode in the opening in such a manner that the electrode faces the third semiconductor layer through the insulating film in the region interposed between the pair of insulator spacers.

Preferably, according to a ninth aspect, in the semiconductor device manufacturing method, in the step of forming the fourth semiconductor layer, the impurity of the first conductivity type is introduced through the region interposed between the pair of insulator spacers.

Preferably, according to a tenth aspect, in the semiconductor device manufacturing method, in the step of forming the fourth semiconductor layer, the fourth semiconductor layer is formed apart from the second semiconductor layer.

According to the device of the first aspect, an electrode facing the third semiconductor layer is buried in a trench formed in the main surface of the semiconductor substrate and the second semiconductor layer is formed on both sides of the trench. The second semiconductor layer is thus formed in shallower regions than the third semiconductor layer. This suppresses expansion of a depletion layer (i.e. drain depletion layer) from the part of the second semiconductor layer located on one side of the trench (i.e. drain layer) to the part located on the other side of the trench (i.e. source layer), thus preventing the punch-through. Furthermore, the fourth semiconductor layer can be formed in a shallow region since the second semiconductor layer is shallower than the third semiconductor layer, so that the PN junction between the third semiconductor layer and the fourth semiconductor layer exhibits a profile (i.e. impurity concentration distribution) with high concentration and sharp variations. This reduces the threshold voltage and enhances the driving capability, and also enables miniaturization of the device.

According to the device of the second aspect, the presence of the insulator spacers in the trench reduces the length of the channel region (i.e. channel length) formed by parts of the third and fourth semiconductor layers located right under the electrode. As a result, the channel resistance can be reduced to enhance the driving capability of the device.

According to the device of the third aspect, the presence of the insulator spacers in the opening reduces the length of the channel region (i.e. channel length) formed by parts of the third and fourth semiconductor layers located right under the electrode. As a result the channel resistance can be reduced to enhance the driving capability of the device.

According to the device of the fourth aspect, the fourth semiconductor layer is narrower than the third semiconductor layer, so that the parasitic capacitance between the second semiconductor layer and the fourth semiconductor layer can be reduced. This increases the operating speed of the device.

According to the device of the fifth aspect, the second semiconductor layer and the fourth semiconductor layer are spaced apart from each other and therefore they do not form a JP junction. As a result, the junction capacitance which is parasitic capacitance due to PN junction can be reduced to further improve the operating speed of the device.

According to the manufacturing method of the sixth aspect, the third and fourth semiconductor layers are formed after the second semiconductor layer has been formed. Accordingly, it is possible to suppress impurity diffusion in the third and fourth semiconductor layers by eliminating the influence of high-temperature thermal process for activating the impurity in the second semiconductor layer (i.e. source/drain anneal). Therefore the PN junction between the third semiconductor layer and the fourth semiconductor layer exhibits a profile with high concentration and sharp variations. This reduces the threshold voltage and enhances the driving capability, and also enables miniaturization of the device. Furthermore, the source/drain annealing can be performed at higher temperatures to more highly activate the impurity, which reduces the parasitic resistance and thus enhances the driving capability.

Moreover, the electrode facing the third semiconductor layer is buried in the trench formed in the main surface of the semiconductor substrate and the second semiconductor layer is formed on both sides of the trench, and thus the second semiconductor layer is formed in shallower regions than the third semiconductor layer. This provides a device having higher punch-through resistance. Further, the fact that the second semiconductor layer is shallower than the third semiconductor layer is also advantageous in forming a PN junction profile with high concentration and sharp variations between the third semiconductor layer and the fourth semiconductor layer.

According to the manufacturing method of the seventh aspect, a pair of insulator spacers are formed to cover a pair of side surfaces of the trench and the fourth semiconductor layer is formed by introducing the impurity through the region between the pair of insulator spacers. Accordingly the fourth semiconductor layer can be formed in a narrower region to reduce the junction capacitance with the second semiconductor layer. Further, the electrode buried in the trench is formed in the narrower region interposed between the pair of insulator spacers, which reduces the channel length. As a result, the channel resistance can be reduced to enhance the driving capability of the device.

According to the manufacturing method of the eighth aspect, the third and fourth semiconductor layers are formed after the second semiconductor layer has been formed. Accordingly, impurity diffusion in the third and fourth semiconductor layers can be suppressed, without being affected by the high-temperature thermal process for activating the impurity in the second semiconductor layer (i.e. source/drain annealing). Therefore the PN junction between the third semiconductor layer and the fourth semiconductor layer can exhibit a profile with high concentration and sharp variations. This reduces the threshold voltage and enhances the driving capability, and also enables miniaturization of the device. Moreover, the source/drain anneal can be performed at higher temperatures to more highly activate the impurity, which reduces the parasitic resistance, thus enhancing the driving capability.

According to the manufacturing method of the ninth aspect, the fourth semiconductor layer is formed after formation of the pair of insulator spacers by introducing the impurity of the first conductivity type through the region between the pair of insulator spacers. Therefore the fourth semiconductor layer is formed in a narrower region than the third semiconductor layer, which reduces the parasitic capacitance between the second semiconductor layer and the fourth semiconductor layer, thus improving the operating speed of the device.

According to the manufacturing method of the tenth aspect, the second semiconductor layer and the fourth semiconductor layer are separated apart from each other and therefore they do not form a PN junction. This reduces the junction capacitance, i.e. PN-junction-induced parasitic capacitance, thus improving the operating speed of the device.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 7 are diagrams showing a process for manufacturing the semiconductor device of FIG. 1.

DESCRIPTION OF THE PREFERRED EMBODIMENTS

Figure 1:
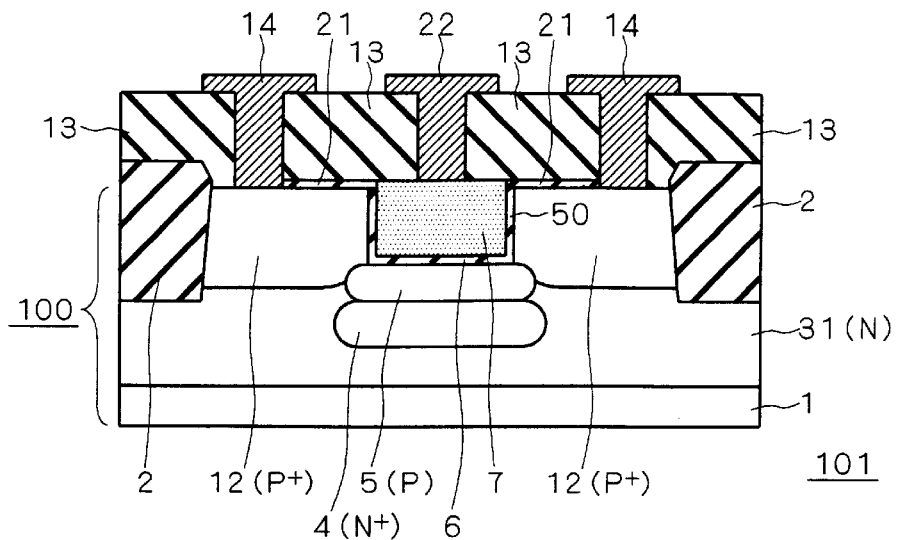
FIG. 1 is a front section showing a semiconductor device according to a first preferred embodiment of the invention.

Semiconductor devices according to preferred embodiments of the present invention and manufacturing methods thereof are now described referring to the drawings. In the drawings, parts which are the same as or corresponding to (having the same functions as) those in the conventional devices shown in FIGS. 29 to 36 are shown at the same reference characters. The conditions for introducing impurity elements shown below will be changed according to general scaling law as the miniaturization advances in the future.

First Preferred Embodiment

FIG. 1 is a front section showing a semiconductor device according to a first preferred embodiment. In this semiconductor device 101, element isolation regions 2 are selectively formed in the main surface of the semiconductor substrate 100 as a silicon substrate and various semiconductor elements are formed in element regions surrounded by the element isolation regions 2. These semiconductor elements include the buried-channel pMOSFET shown in FIG. 1. The pMOSFET of FIG. 1 has a trench 50 selectively formed in the main surface of the semiconductor substrate 100. An N-type well layer 31 is formed deeper than the trench 50 in the main surface of the semiconductor substrate 100. The semiconductor layer 1 is left as part of the semiconductor substrate 100 under the well layer 31.

P-type source/drain layers 12 are formed on sides of the trench 50; the P-type source/drain layers 12 are shallower than the well layer 31 and are exposed on the main surface. A P-type counter doped layer 5 is selectively formed under the trench 50; the counter doped layer 5 is in contact with the trench 50 and is coupled to the source/drain layers 12. The P-type counter doped layer 5 is deeper than the source/drain layers 12 and shallower than the well layer 31. An N-type punch-through stopper layer 4 is selectively formed under the counter doped layer 5; the punch-through stopper layer 4 is in contact with the bottom of the counter doped layer 5 and has a higher impurity concentration than the well layer 31.

The punch-through stopper layer 4 is spaced apart from the source/drain layers 12. Specifically, the punch-through stopper layer 4 is formed in a small area under the trench 50 so that it does not form a PN junction with the source/drain layers 12.

The inner surface of the trench 50 is covered with an insulating film 6 composed of silicon oxide, for example. On the main surface of the semiconductor substrate 100, the region around the trench 50 is also covered with an insulating film 21 composed of silicon oxide, for example. A gate electrode 7 is buried in the trench 50 and faces the counter doped layer 5 with the insulating film 6 interposed therebetween.

The main surface of the semiconductor substrate 100 is further covered with an insulating layer 13. Through holes are selectively formed in this insulating layer 13, through which source/drain electrodes 14 are connected to the source/drain layers 12 and an gate interconnection 22 is connected to the gate electrode 7.

As explained above, in the semiconductor device 101, the gate electrode 7 facing the counter doped layer 5 is buried in the trench 50 and the source/drain layers 12 are formed on sides of the trench 50, and thus the source/drain layers 12 are shallower than the counter doped layer 5. This suppresses extension of the drain depletion layer from one of the source/drain layers 12 to the other, i.e. from the drain layer to the source layer, thus preventing occurrence of punch-through. Further, since the source/drain layers 12 are shallower than the counter doped layer 5, the punch-through stopper layer 4 can be formed shallower. Therefore the PN junction between the counter doped layer 5 and the punch-through stopper layer 4 exhibits a profile (i.e. impurity concentration distribution) with higher concentration and sharp variations. This reduces the threshold voltage and enhances the driving capability, and also enables miniaturization of the device.

Furthermore, since the source/drain layers 12 and the punch-through stopper layer 4 are spaced apart from each other, they do not form a PN junction between them. Accordingly, the junction capacitance, which is parasitic capacitance due to PN junction, can be reduced to further increase the operating speed of the device.

Figure 2:
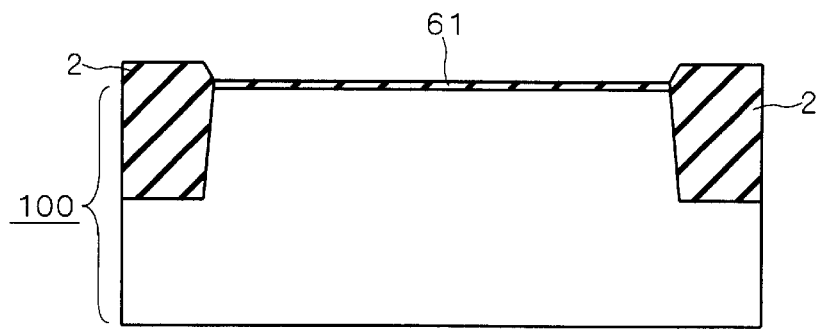

Next, a method of manufacturing the semiconductor device 101 of FIG. 1 is described. FIGS. 2 to 7 are manufacture process diagrams showing a method of manufacturing the semiconductor device 101. In the manufacture of the semiconductor device 101, the process shown in FIG. 2 is performed first. In the process of FIG. 2, the semiconductor substrate 100 is prepared and the element isolation regions 2 are formed in its main surface by LOCOS etc. A thermal oxidation is then performed to form an oxide film 61 on the main surface of the semiconductor device 101 to a thickness of 30 nm, for example.

Figure 3:
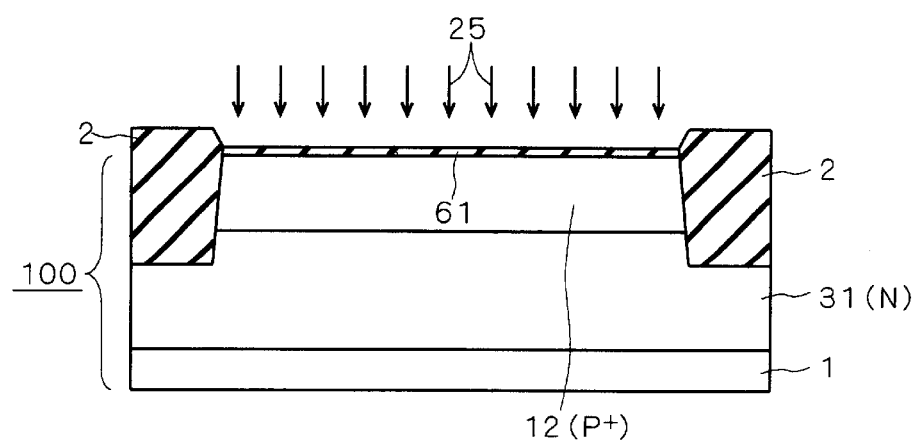

In the next process of FIG. 3, phosphorus is implanted into the main surface of the semiconductor substrate 100 to form the N-type well layer 31. Then boron 25 is implanted by ion implantation with an implantation energy of 5 to 30 keV to a dose of $1.0 \times 10^{15}$ ions/cm$^2$ or more, so as to form the P-type source/drain layers 12 which are not yet divided into a source layer and drain layer at this stage. A high-temperature thermal process is then performed for activation and repair of crystal defects produced during the ion implantation for formation of the source/drain layers 12. These ion implantation and thermal process are performed in such a manner that the source/drain layers 12 are formed shallower than the well layer 31 after the thermal process.

In the next process shown in FIG. 4, the oxide film 61 is removed and another thermal oxidation is applied to form an oxide film 62 having a thickness of 10 nm or more on the main surface of the semiconductor substrate 100. The oxide film 62 is formed thick enough to protect the main surface of the semiconductor substrate 100 during formation of the polysilicon gate in a later process. Next, a resist pattern is formed (not shown) and the oxide film 62 is selectively etched by using the pattern as a mask. An opening is thus selectively formed in the oxide film 62. The resist pattern is then removed. Next, using the oxide film 62 as a mask, the main surface of the semiconductor substrate 100 is selectively etched to form the trench 50 in the main surface of the semiconductor substrate 100; the trench 50 is formed to about the same depth as the source/drain layers 12. The trench 50 is formed in a position dividing the source/drain layers 12. When boron is implanted at 20 keV, the depth of the source/drain layers 12 is about 0.2 μm. In this case, the etching is performed to form the trench 50 to a depth of about 0.2 μm.

In the next process shown in FIG. 5, phosphorus is implanted by ion implantation with an implantation energy of 100 keV to a dose of $6.0 \times 10^{12}$ ions/cm$^2$ or more to form the punch-through stopper layer 4 under the trench 50. Subsequently, boron is implanted with an implantation energy of 20 keV and, as in the formation of the punch-through stopper layer 4, to a dose of $6.0 \times 10^{12}$ ions/cm$^2$ or more, so as to form the counter doped layer 5 under the trench 50. That is to say, the impurities introduced through the trench 50 form the counter doped layer 5 and the punch-through stopper layer 4. The counter doped layer 5 may be formed before the punch-through stopper layer 4 is formed.

The counter doped layer 5 is in contact with the bottom of the trench 50 and is coupled to the source/drain layers 12, and deeper than the source/drain layers 12 and shallower than the well layer 31. The punch-through stopper layer 4 has a higher impurity concentration than the well layer 31 and is formed in such a way that it comes in contact with the bottom of the counter doped layer 5 after the counter doped layer 5 is formed. The punch-through stopper layer 4 is spaced apart from the source/drain layers 12.

In the next process shown in FIG. 6, a thermal oxidation is first performed to form the insulating film 6, which is an oxide film, to a thickness of 2 to 15 nm on the surface of the trench 50. This process may be performed after formation of the trench 50 and before formation of the counter doped layer 5 or the punch-through stopper layer 4. Subsequently, a polycrystalline silicon layer 24 containing phosphorus at a concentration of $1 \times 10^{20}$/cm$^3$ or more is deposited by LPCVD (Low Pressure CVD) over the main surface of the semiconductor substrate 100 to a thickness of 50 to 150 nm so as to fill the trench 50. This process is performed after both of the punch-through stopper layer 4 and the counter doped layer 5 have been formed.

Figure 7:
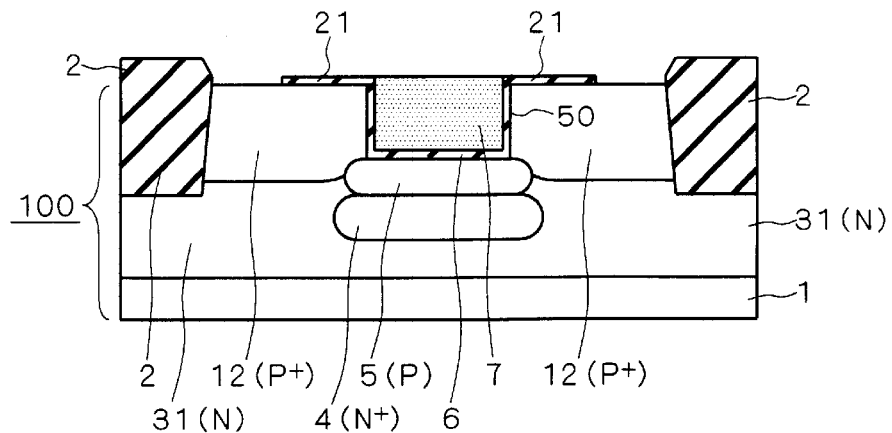

In the next process of FIG. 7, the deposited polycrystalline silicon layer is etched back except in the part filling the trench 50. This forms the gate electrode 7 which is buried in the trench 50 and faces the counter doped layer 5 through the insulating film 6. The insulating film 62 is then selectively removed to form the insulating film 21.

Subsequently, referring to FIG. 1 again, the insulating layer 13, source/drain electrodes 14, and gate interconnection 22 are formed to complete the semiconductor device 101.

In the manufacturing method above, the counter doped layer 5 and the punch-through stopper layer 4 are formed after the source/drain layers 12 have been formed. Therefore it is possible to suppress diffusion of the impurities in the counter doped layer 5 and the punch-through stopper layer 4 by eliminating the influence of the source/drain annealing or the high-temperature thermal process for activating the impurity in the source/drain layers 12. Hence the PN junction between the counter doped layer 5 and the punch-through stopper layer 4 exhibits a profile with high concentration and sharp variations. This lowers the threshold voltage and enhances the driving capability, and also enables miniaturization of the device. Moreover, the source/drain annealing can be performed at higher temperatures to more highly activate the impurity, which reduces the parasitic resistance and thus enhances the driving capability.

Second Preferred Embodiment

Figure 8:
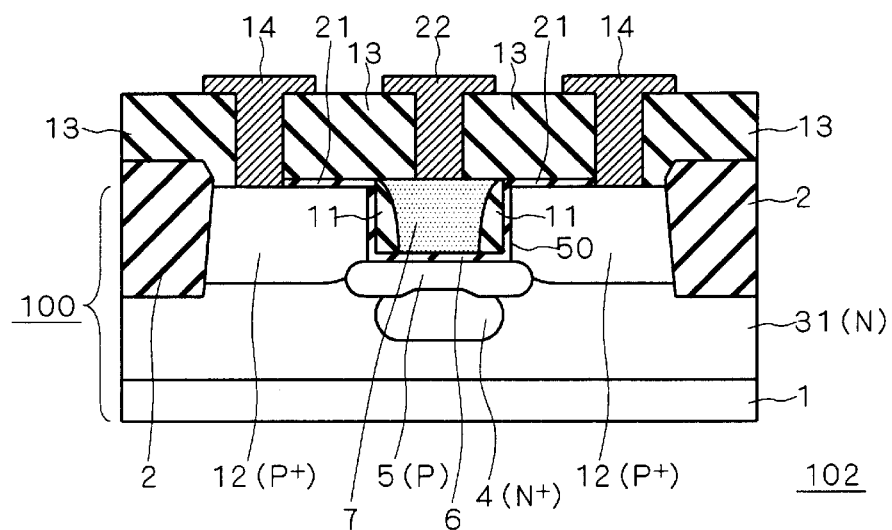
FIG. 8 is a front section showing a semiconductor device according to a second preferred embodiment of the invention.

FIG. 8 is a front section showing a semiconductor device according to a second preferred embodiment. Like the semiconductor device 101 of the first preferred embodiment, this semiconductor device 102 has a buried-channel pMOSFET. However, this semiconductor device 102 characteristically differs from the semiconductor device 101 of the first preferred embodiment in that a pair of insulator spacers 11 are formed at an interval on a pair of side surfaces of the trench 50 which face the source/drain layers 12. The gate electrode 7 faces the counter doped layer 5 in the region interposed between the pair of insulator spacers 11. This reduces the length of the channel region formed by part of the counter doped layer 5 and the punch-through stopper layer 4 located right under the gate electrode 7. That is, the channel length is reduced. As a result, the channel resistance is reduced and the driving capability of the device is enhanced.

Figure 9:
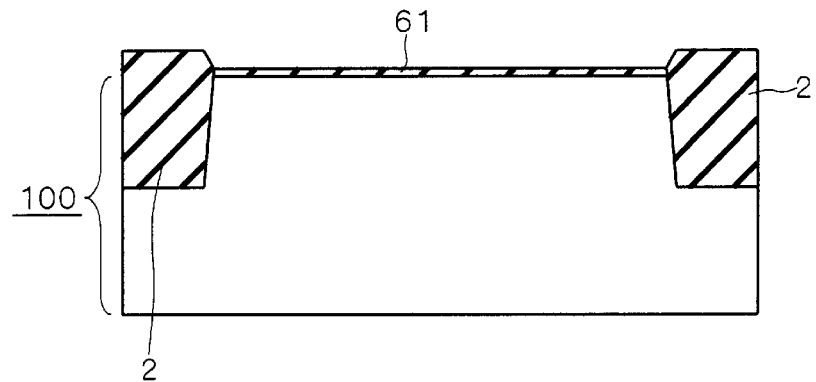
FIGS. 9 to 16 are diagrams showing a process for manufacturing the semiconductor device of FIG. 8.
Figure 10:
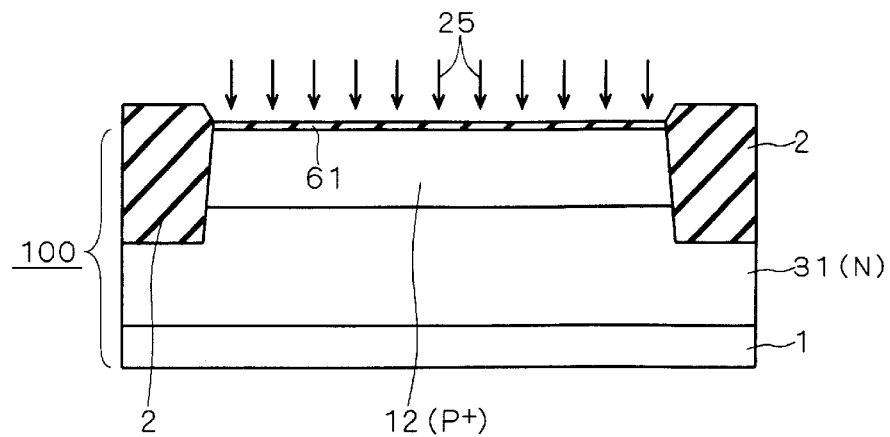
Figure 11:
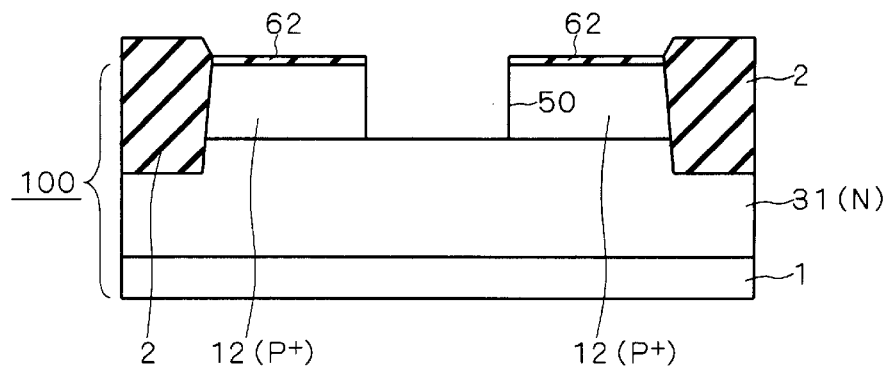

Next, a method of manufacturing the semiconductor device 102 of FIG. 8 is described. FIGS. 9 to 16 are manufacture process diagrams showing a method of manufacturing the semiconductor device 102. In the manufacture of the semiconductor device 102, the process shown in FIG. 9 is performed first. In the process of FIG. 9, the same process as that shown in FIG. 2 is performed to prepare the semiconductor substrate 100 and then the element isolation regions 2 and the oxide film 61 are formed on the main surface of the semiconductor substrate 100. In the next process of FIG. 10, the same process as that of FIG. 3 is performed to form the P-type source/drain layers 12. In the next process of FIG. 11, the same process as that of FIG. 4 is performed to form the oxide film 62 and the trench 50.

Figure 12:
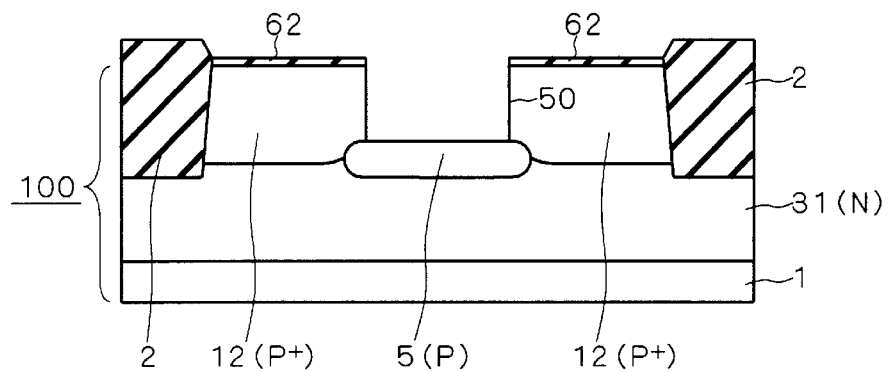

In the next process shown in FIG. 12, boron is implanted with an implantation energy of 20 keV to a dose of $6.0 \times 10^{12}$ ions/cm$^2$ or more to form the counter doped layer 5 under the trench 50. That is to say, boron is introduced through the trench 50 into the region under the trench 50. The counter doped layer 5 is in contact with the bottom of the trench 50 and is coupled to the source/drain layers 12, and it is deeper than the source/drain layers 12 and shallower than the well layer 31.

Figure 13:
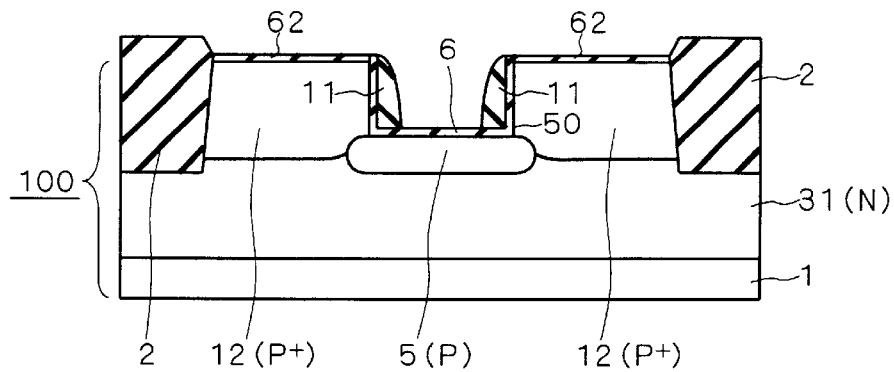

In the next process shown in FIG. 13, a thermal oxidation is first performed to form the insulating film 6, which is an oxide film, on the surface of the trench 50 to a thickness of 2 to 15 nm. This process may be performed after formation of the trench 50 and before formation of the counter doped layer 5. Subsequently, a silicon oxide film (not shown) is deposited on the main surface of the semiconductor substrate 100 to a thickness of about 30 nm to fill the trench 50. The deposited silicon oxide film is then etched back by wet etching to form the pair of insulator spacers 11 covering the pair of side surfaces of the trench 50 which face the source/drain layers 12. The pair of insulator spacers 11 are spaced apart from each other.

Figure 14:
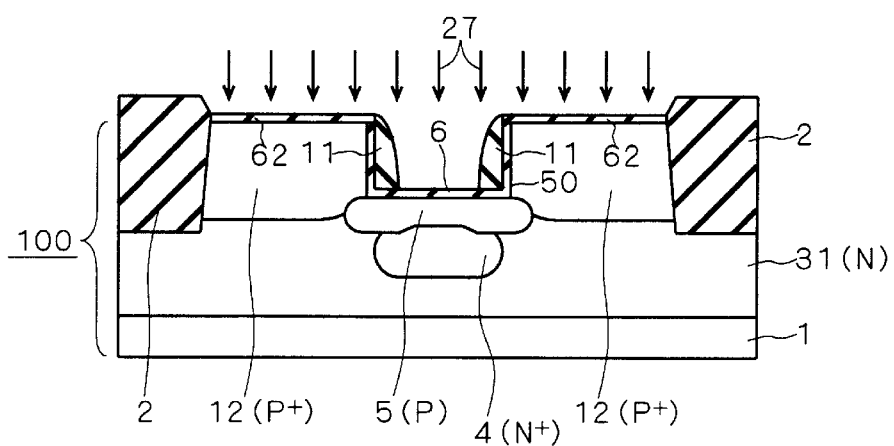

In the next process shown in FIG. 14, for example, phosphorus 27 is implanted by ion implantation with an implantation energy of 100 keV to a dose of $6.0 \times 10^{12}$ ions/cm$^2$ or more to form the punch-through stopper layer 4 under the trench 50. In this process, the pair of insulator spacers 11 function as masks. That is to say, phosphorus is introduced into the area under the trench 50 through the region between the pair of insulator spacers 11. Therefore the punch-through stopper layer 4 is formed in a narrower region and is therefore spaced more apart from the source/drain layers 12 than when the insulator spacers 11 are absent (e.g. the first preferred embodiment).

Figure 15:
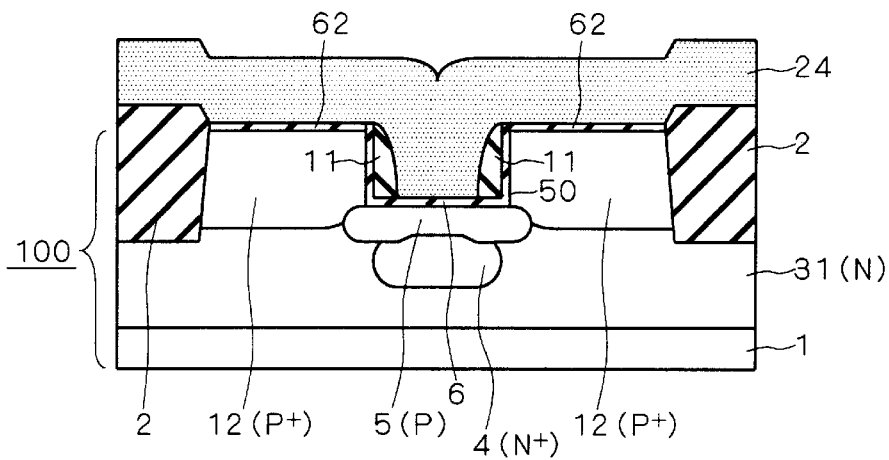

In the next process shown in FIG. 15, a polycrystalline silicon layer 24 containing phosphorus at a concentration of $1 \times 10^{20}$/cm$^3$ or more is deposited by LPCVD over the main surface of the semiconductor substrate 100 to a thickness of 50 to 150 nm to fill the trench 50.

Figure 16:
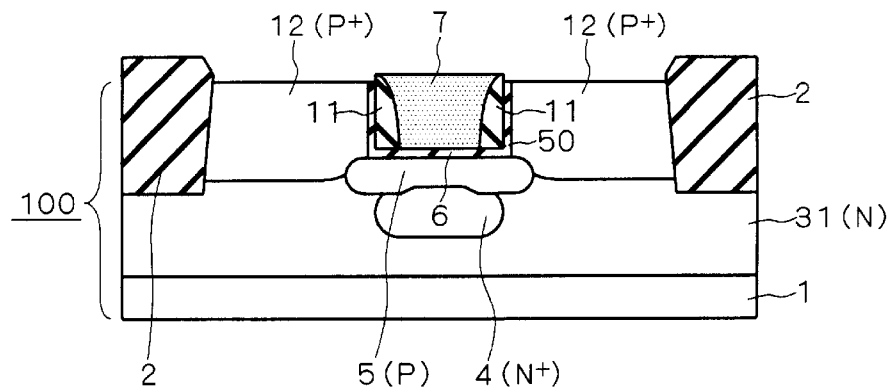

In the next process shown in FIG. 16, the deposited polycrystalline silicon layer 24 is etched back except in the part filling the trench 50. This forms the gate electrode 7 which is buried in the trench 50 and faces the counter doped layer 5 through the insulating film 6 in the region between the pair of insulator spacers 11. The insulating film 62 is then removed.

Next, referring to FIG. 8 again, the insulating layer 13, source/drain electrodes 14, and gate interconnection 22 are formed to complete the semiconductor device 102.

In the manufacturing method above, the pair of insulator spacers 11 are formed to cover the pair of side surfaces of the trench 50, and then the punch-through stopper layer 4 is formed by introducing phosphorus through the region between the pair of insulator spacers 11. Hence the punch-through stopper layer 4 can be formed in a narrower region and the junction capacitance with the source/drain layers 12 can be reduced.

Third Preferred Embodiment

Figure 17:
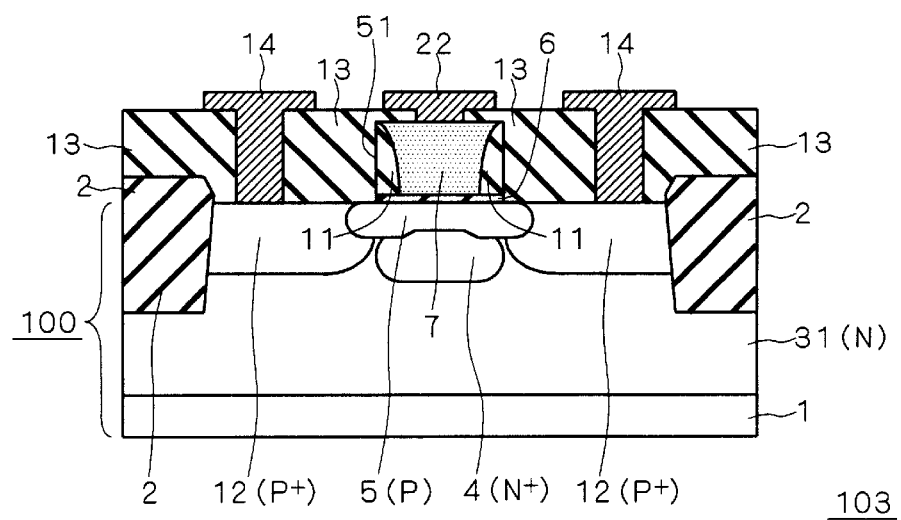
FIG. 17 is a front section showing a semiconductor device according to a third preferred embodiment of the invention.

FIG. 17 is a front section showing a semiconductor device according to a third preferred embodiment. Like the semiconductor device 101 of the first preferred embodiment, this semiconductor device 103 has a buried-channel pMOSFET. The element isolation regions 2 are selectively formed in the main surface of the semiconductor substrate 100 which is a silicon substrate, and the pMOSFET depicted in FIG. 17 is formed in at least one of the element regions surrounded by the element isolation regions 2.

As well as the pMOSFET of FIG. 1, the pMOSFET of FIG. 17 has the N-type well layer 31 formed in the main surface of the semiconductor substrate 100. However, note that the trench 50 (FIG. 1) is not formed in the main surface of the semiconductor substrate 100; the P-type source/drain layers 12 shallower than the well layer 31 are separated at an interval and are selectively exposed on the main surface. The P-type counter doped layer 5 is formed in the above-mentioned interval, i.e. in the space interposed between the source/drain layers 12, in the main surface of the semiconductor substrate 100 and is coupled to the source/drain layers 12. The N-type punch-through stopper layer 4 having higher impurity concentration than the well layer 31 is selectively formed in contact with the bottom of the counter doped layer 5 in such a way that in the width across the above-mentioned interval, the N-type punch-through stopper layer 4 is narrower than the counter doped layer 5. The punch-through stopper layer 4 is separated apart from the source/drain layers 12 and therefore no PN junction is formed between the punch-through stopper layer 4 and the source/drain layers 12.

The insulating layer 13 is formed on the main surface of the semiconductor substrate 100 and an opening 51 opening over the above-mentioned interval is formed in the insulating layer 13. The pair of side surfaces of the opening 51 which face across the above-mentioned interval are covered with a pair of insulator spacers 11 spaced apart from each other. The part of the main surface which is exposed in the opening 51 is covered with the insulating film 6. The gate electrode 7 is buried in the opening 51 and faces the counter doped layer 5 through the insulating film 6 in the region between the pair of insulator spacers 11 in the opening 51.

Through holes are selectively formed in the insulating layer 13, through which the source/drain electrodes 14 are connected to the source/drain layers 12 and the gate interconnection 22 is connected to the gate electrode 7.

As explained above, in the semiconductor device 103, the insulator spacers 11 are formed in the opening 51, which reduces the length of the channel region formed by parts of the counter doped layer 5 and the punch-through stopper layer 4 located right under the gate electrode 7. That is, the channel length is reduced. This reduces the channel resistance and thus enhances the driving capability of the device. Furthermore, since the punch-through stopper layer 4 is narrower than the counter doped layer 5, the parasitic capacitance between the source/drain layers 12 and the punch-through stopper layer 4 is reduced, which improves the operating speed of the device. Particularly, the source/drain layers 12 and the punch-through stopper layer 4 are spaced apart from each other and no PN junction is formed between them, so that the parasitic capacitance can be remarkably reduced.

Figure 18:
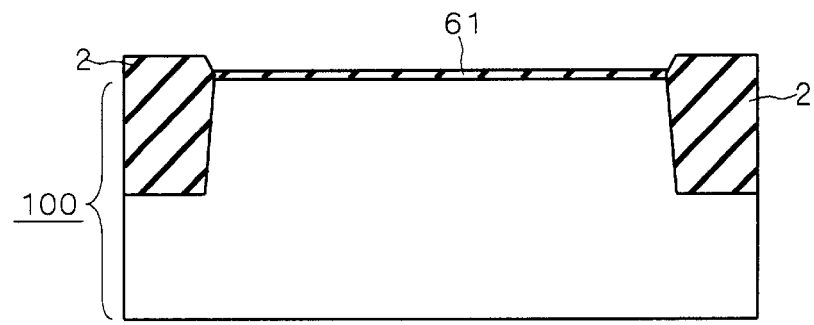
FIGS. 18 to 28 are diagrams showing a process for manufacturing the semiconductor device of FIG. 17.
Figure 19:
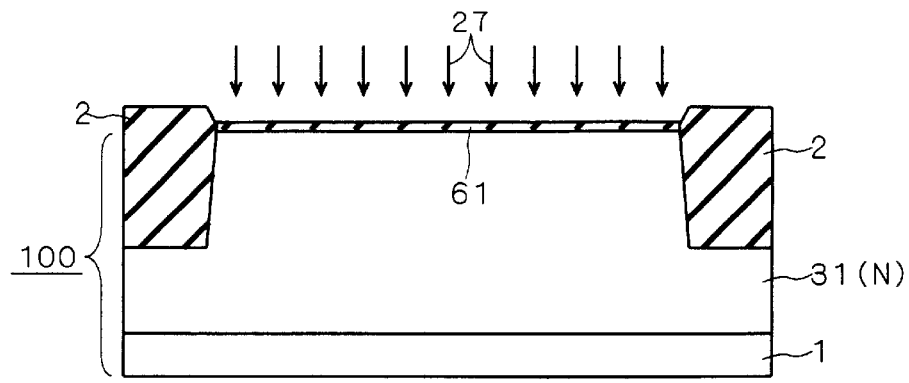

Next, a method of manufacturing the semiconductor device 103 of FIG. 17 is described. FIGS. 18 to 28 are manufacturing process diagrams showing a manufacturing method of the semiconductor device 103. In the manufacture of the semiconductor device 103, the process shown in FIG. 18 is performed first. In the process shown in FIG. 18, the same process as that of FIG. 2 is performed to prepare the semiconductor substrate 100, and the element isolation regions 2 and the oxide film 61 are formed on the main surface of the semiconductor substrate 100. In the next process shown in FIG. 19, phosphorus 27 is implanted into the main surface of the semiconductor substrate 100 to form the N-type well layer 31.

Figure 20:
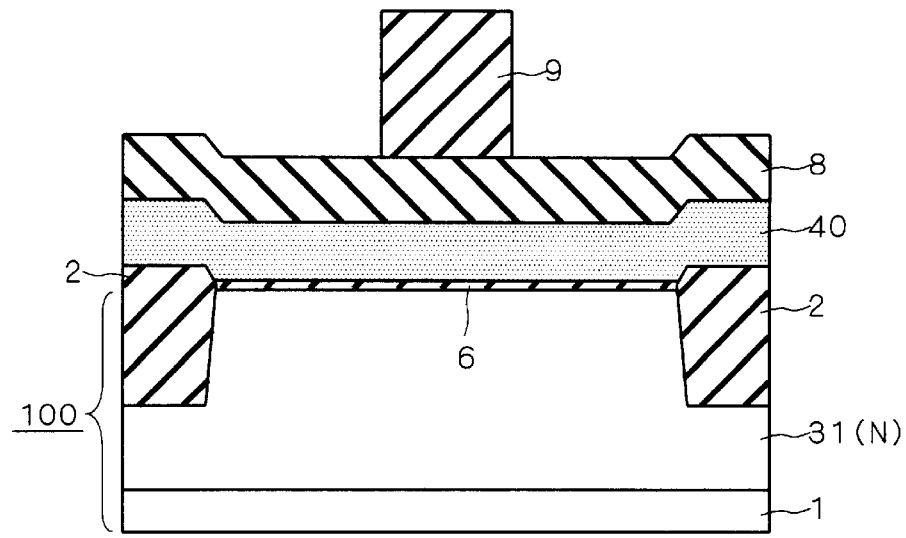

In the next process of FIG. 20, thermal oxidation is applied to form the insulating film 6, which is an oxide film, on the main surface of the semiconductor substrate 100 to a thickness of 2 to 15 nm. Subsequently, polycrystalline silicon 40 containing no impurity is deposited by LPCVD to a thickness of 50 to 150 nm to cover the main surface of the semiconductor substrate 100. Next, a silicon oxide film 8 is deposited by CVD to a thickness of 20 run as an etching mask for formation of the gate electrode, which is followed by formation of a resist pattern 9 for forming the gate electrode.

Figure 21:
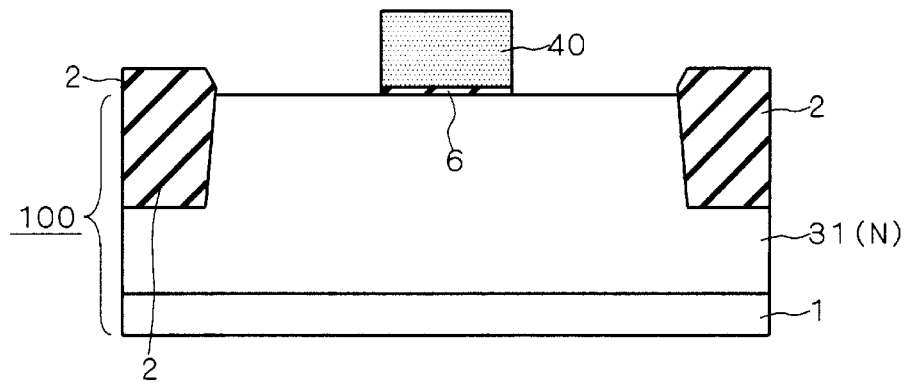

In the next process of FIG. 21, by using the resist pattern 9 as a mask, the silicon oxide film 8, polycrystalline silicon 40, and insulating film 6 are selectively etched to pattern the polycrystalline silicon 40 and the insulating film 6. The resist pattern 9 is then removed. The patterned polycrystalline silicon 40 is used as a mask in the next process.

Figure 22:
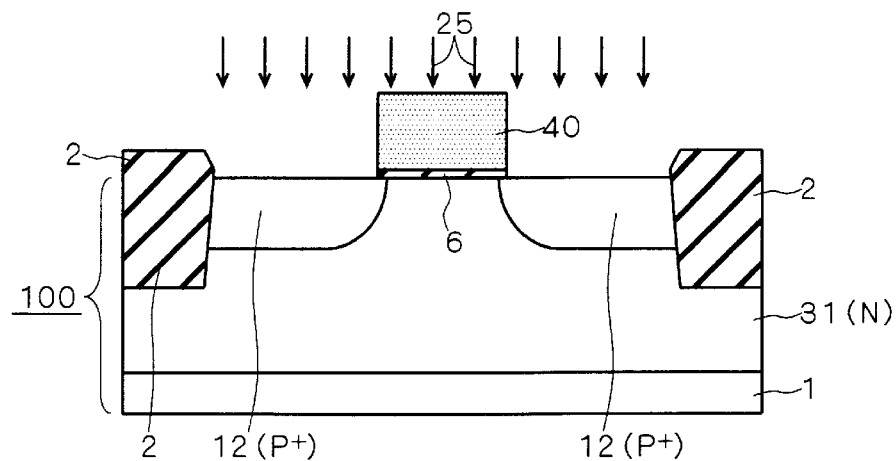

In the next process of FIG. 22, boron is implanted by ion implantation with an implantation energy of 5 to 30 keV to a dose of $1.0 \times 10^{15}$ ions/cm$^2$ or more, so as to form the P-type source/drain layers 12. The patterned polycrystalline silicon 40 functions as a mask, so that an interval is formed right under the polycrystalline silicon 40 between the source/drain layers 12. A high-temperature thermal process is then performed for activation and repair of crystal defects produced during the ion implantation for formation of the source/drain layers 12. These ion implantation and thermal process are performed in such a way that the source/drain layers 12 are formed in a shallower area than the well layer 31 after the thermal process.

Figure 23:
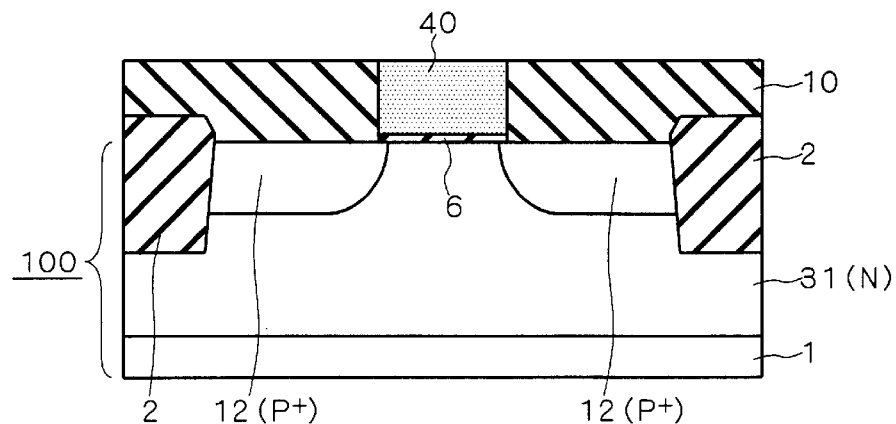

In the next process of FIG. 23, an insulating layer 10, which is a silicon oxide, is deposited to cover the main surface of the semiconductor substrate 100; the insulating layer 10 is deposited to a thickness of 50 to 150 nm so that it forms approximately as high as the polycrystalline silicon 40. Subsequently the upper surface of the polycrystalline silicon 40 and the insulating layer 10 is polished by CMP (Chemical Mechanical Polishing) so that the upper surface of the polycrystalline silicon 40 is exposed.

Figure 24:
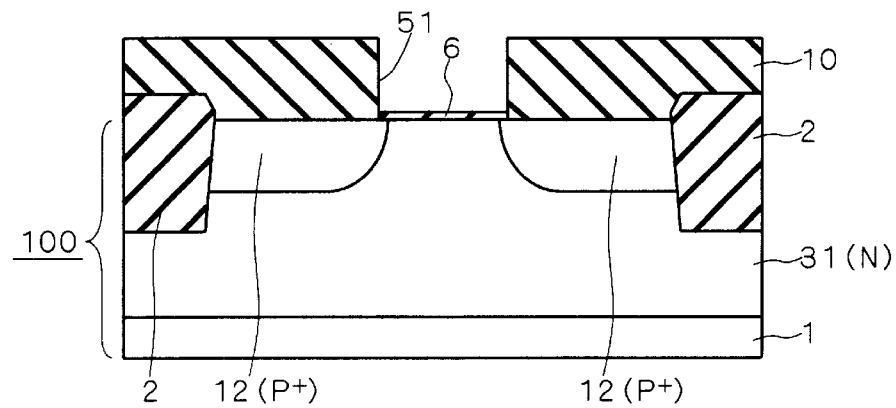

In the next process of FIG. 24, selective etching using hydrofluoric acid vapor is applied to remove the polycrystalline silicon 40 only. The opening 51 is thus selectively formed in the insulating layer 10.

Figure 25:
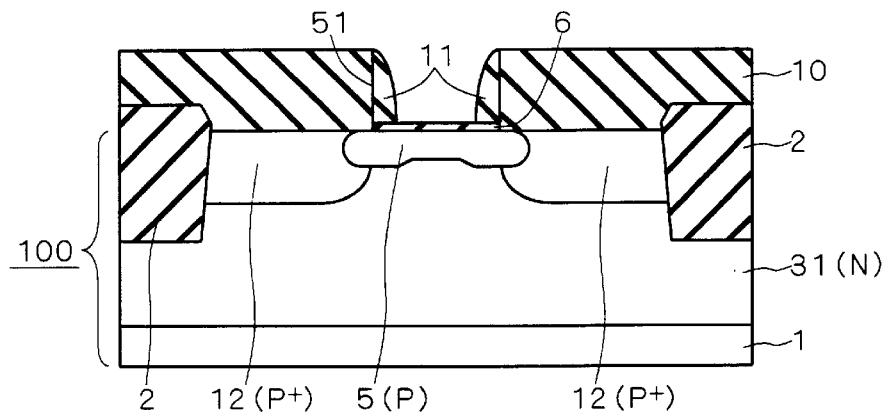

In the next process of FIG. 25, boron is implanted with an implantation energy of 20 keV to a dose of $6.0 \times 10^{12}$ ions/cm$^2$ or more to form the counter doped layer 5 under the opening 51 in the main surface of the semiconductor substrate 100. Specifically, boron is introduced through the opening 51 to the region under the opening 51 to form the counter doped layer 5 in the space between the source/drain layers 12. Then a thermal process is performed to activate the introduced boron. The implantation and activation of boron are performed so that the counter doped layer 5 is coupled to the source/drain layers 12.

Next, the insulating film 6 formed in the opening 51 is removed and a new version of the insulating film 6, which is a silicon oxide film, is then formed by thermal oxidation to a thickness of 2 to 15 nm to cover the part of the main surface of the semiconductor substrate 100 which is exposed in the opening 51. The insulating film 6 is formed twice for the following purpose. The insulating film 6 damaged during the process of etching the polycrystalline silicon 40 and the following ion implantation is removed and then another insulating film 6 to function as the gate insulating film is formed. For the purpose of only eliminating the effect of the damage caused during the process of etching the polycrystalline silicon 40, the new insulating film 6 may be formed after the process of forming the opening 51 shown in FIG. 24.

Subsequently, a silicon oxide film (not shown) is deposited over the main surface of the semiconductor substrate 100 to a thickness of about 30 nm to fill the opening 51. Then the deposited silicon oxide film is etched back using wet etching to form the pair of insulator spacers 11 covering the pair of side surfaces of the opening 51. The pair of insulator spacers 11 are formed at an interval.

Figure 26:
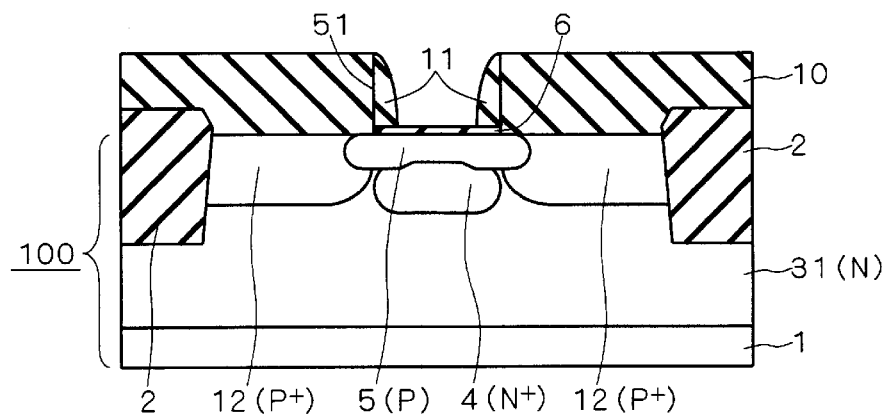

In the next process of FIG. 26, phosphorus is implanted by ion implantation with an implantation energy of 100 keV and, as in the formation of the counter doped layer 5, to a dose of $6.0 \times 10^2$ ions/cm$^2$ or more, so as to form the punch-through stopper layer 4 in contact with the bottom of the counter doped layer 5 under the opening 51. In this process, the pair of insulator spacers 11 function as a mask. That is to say, phosphorus is introduced through the region between the pair of insulator spacers 11 into the part under the opening 51. Therefore, in the width along the channel length direction, the punch-through stopper layer 4 is narrower than the counter doped layer 5. As a result, the punch-through stopper layer 4 is separated apart from the source/drain layers 12 and no PN junction is formed between the punch-through stopper layer 4 and the source/drain layers 12.

Figure 27:
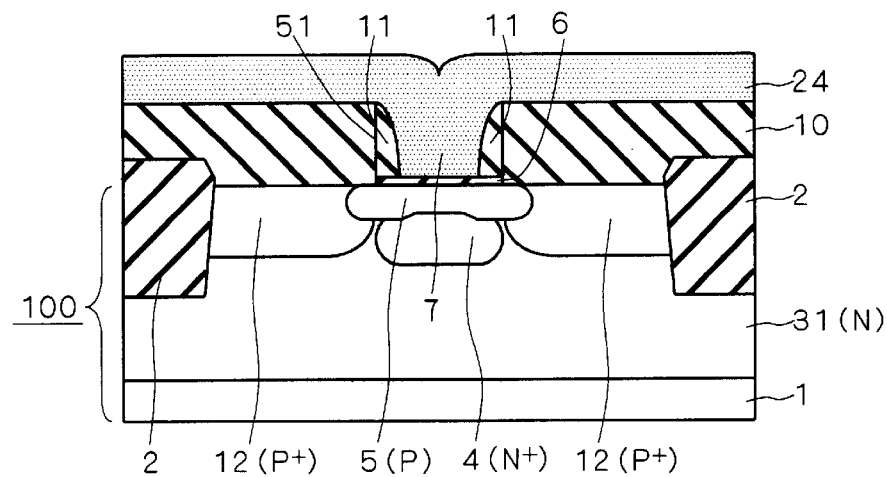

In the next process of FIG. 27, a polycrystalline silicon layer 24 which contains phosphorus at a concentration of $1 \times 10^{20}$/cm$^3$ or more is deposited by LPCVD over the main surface of the semiconductor substrate 100 to a thickness of 50 to 150 nm to fill the opening 51.

Figure 28:
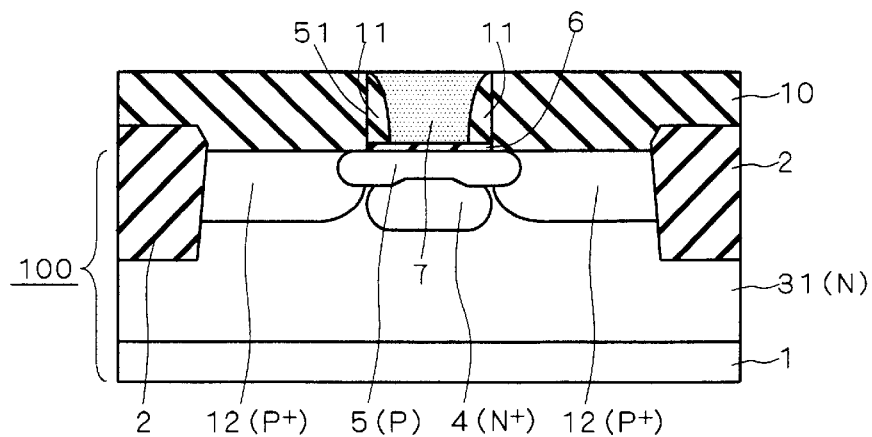
Figure 29:
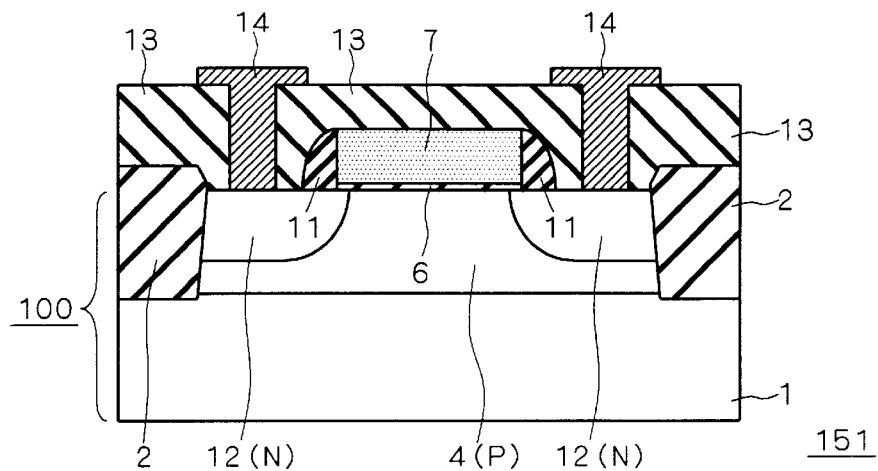
FIG. 29 is a front section showing a conventional surface-channel semiconductor device.
Figure 30:
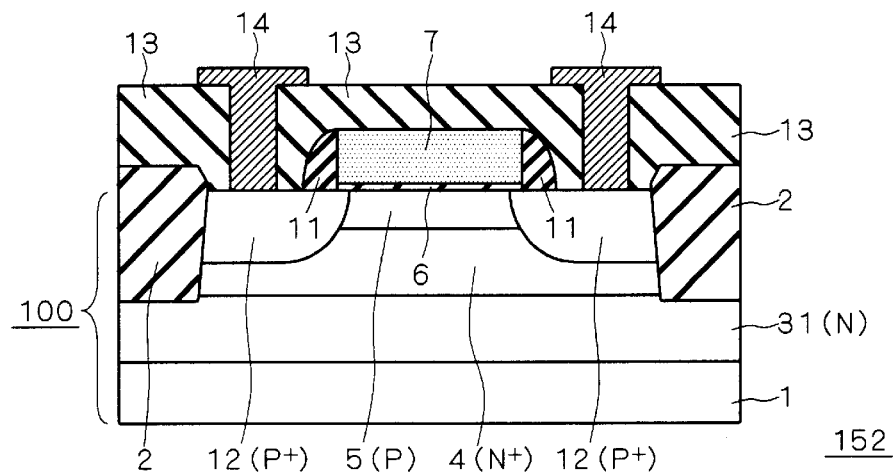
FIG. 30 is a front section showing a conventional buried-channel semiconductor device.
Figure 31:
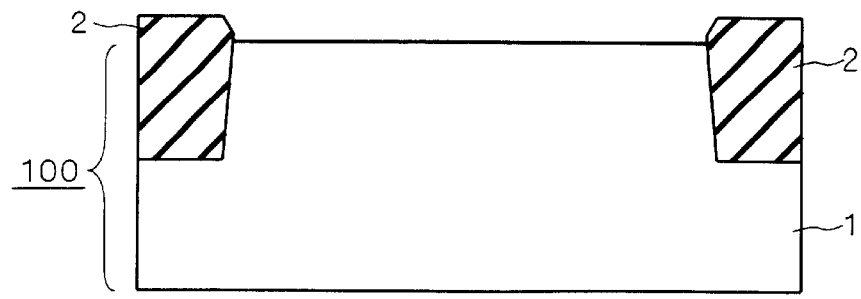
FIGS. 31 to 36 are diagrams showing a process for manufacturing the semiconductor device of FIG. 30.
Figure 32:
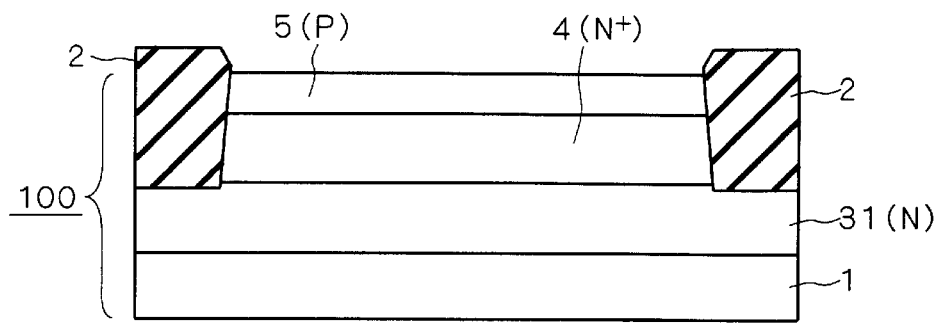
Figure 33:
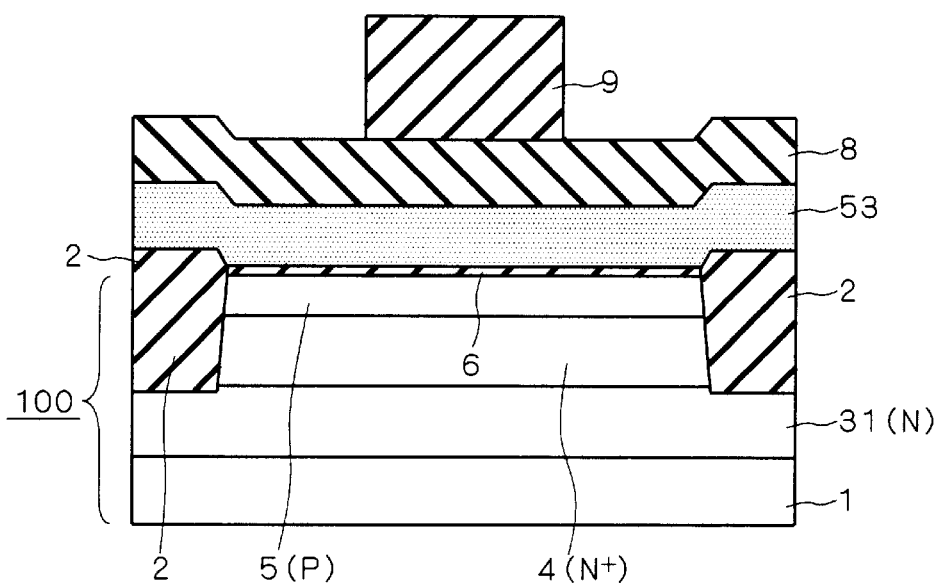
Figure 34:
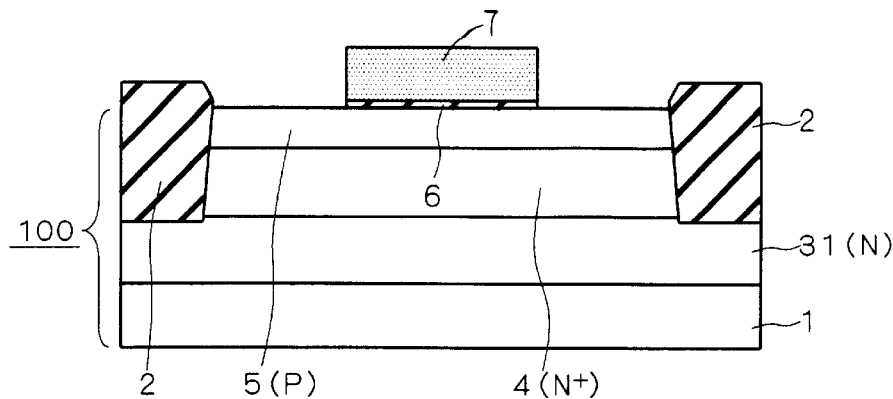
Figure 35:
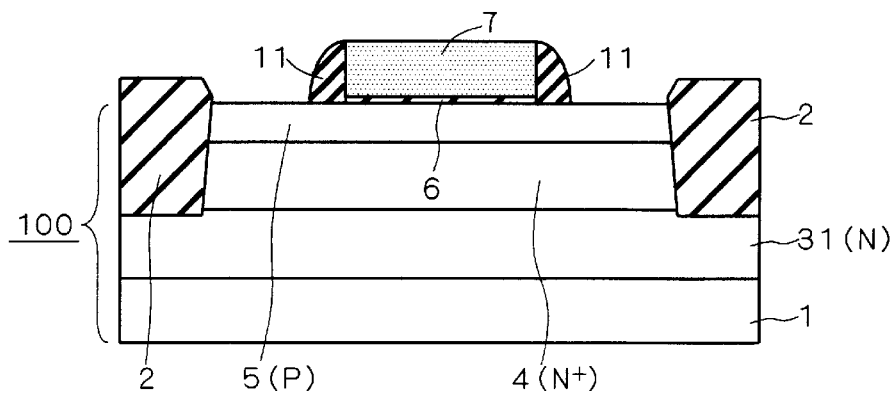
Figure 36:
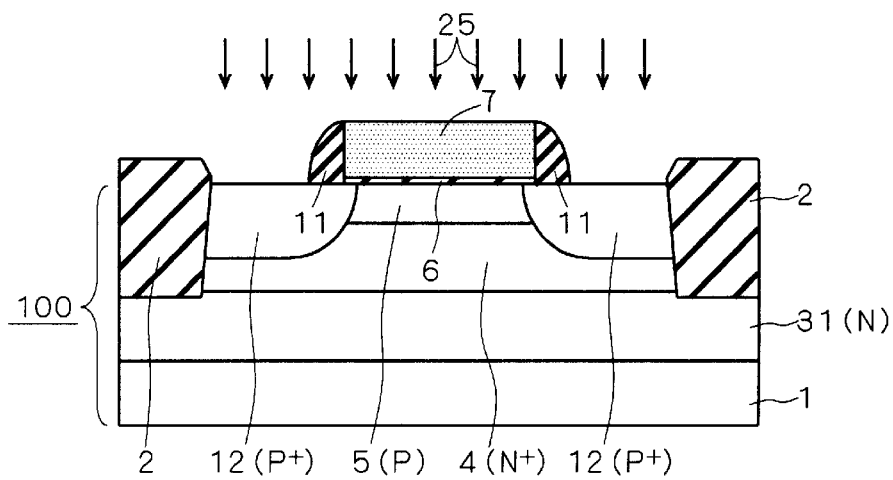

In the next process of FIG. 28, first, the deposited polycrystalline silicon layer 24 is etched back except in the part filling the opening 51. Thus the gate electrode 7 is buried in the opening 51. The gate electrode 7 faces the counter doped layer 5 through the insulating film 6 in the region between the pair of insulator spacers 11.

Subsequently, referring to FIG. 17 again, the insulating layer 13, source/drain electrodes 14 and gate interconnection 22 are formed to complete the semiconductor device 103.

In the manufacturing method above, as in the manufacturing methods of the first and second preferred embodiments, the counter doped layer 5 and the punch-through stopper layer 4 are formed after formation of the source/drain layers 12, which provides the effects of reducing the threshold voltage, reducing the parasitic capacitance, and enhancing the driving capability, like the first and second preferred embodiments.

Modifications (1) The first to third preferred embodiments have shown semiconductor devices having a buried-channel pMOSFET. However, the present invention is applicable also to semiconductor devices having a buried-channel MOSFET of a different polarity (i.e. of a different conductivity type), i.e. a buried-channel nMOSFET. Further, the embodiments have shown examples in which the gate electrode 7 is composed of polycrystalline silicon (i.e. polysilicon). However, generally, polycide gates, silicide gates, or metal gates may be used.

(2) While the embodiments above have shown examples where a semiconductor device has a buried-channel MOSFET, the present invention is generally applicable to semiconductor devices having a buried-channel MOS structure formed in the main surface of a semiconductor substrate 100. For example, the present invention is applicable also to semiconductor devices having a MOS structure such as an IGBT, a thyristor, etc., as long as the MOS structure is of buried channel type.

(3) In the manufacturing methods of the second and third preferred embodiments, the punch-through stopper layer 4 may be formed before formation of the insulator spacers 11, as well as the counter doped layer 5. However, in order to obtain the effect produced by forming the punch-through stopper layer 4 narrower than the counter doped layer 5, it is preferable to form the punch-through stopper layer 4 after formation of the insulator spacers 11.

While the invention has been described in detail, the foregoing description is in all aspects illustrative and not restrictive. It is understood that numerous other modifications and variations can be devised without departing from the scope of the invention.

What is claimed is:

1. A semiconductor device comprising:

a semiconductor substrate having a main surface and a trench selectively formed in said main surface, said semiconductor substrate comprising, a first semiconductor layer of a first conductivity type formed under said trench and a region around said trench, a pair of second semiconductor layers of a second conductivity type formed on said first semiconductor layer on both sides of said trench and exposed on said main surface, a third semiconductor layer of the second conductivity type formed on said first semiconductor layer, said third semiconductor layer being in contact with the bottom of said trench and coupled to said pair of second semiconductor layers, and a fourth semiconductor layer of the first conductivity type selectively formed to cover at least part of the junction between said third semiconductor layer and said first semiconductor layer and having a higher impurity concentration than said first semiconductor layer;

said semiconductor device further comprising, an insulating film covering a surface of said trench;

an electrode buried in said trench and facing said third semiconductor layer with said insulating film interposed therebetween, wherein said fourth semiconductor layer is wider than said third semiconductor layer.

2. The semiconductor device according to claim 1, further comprising a pair of insulator spacers spaced apart from each other and covering a pair of side surfaces of said trench, wherein said electrode faces said third semiconductor layer in a region interposed between said pair of insulator spacers.

3. The semiconductor device according to claim 1, wherein said fourth semiconductor layer is spaced apart from said pair of second semiconductor layers.

* * * * *